United States Patent [19]

De Freitas et al.

[11] Patent Number: 4,462,106
[45] Date of Patent: Jul. 24, 1984

[54] DIGITAL ENCODING CIRCUITRY

[75] Inventors: Richard E. De Freitas, Westford; John J. Blake, Pepperell, both of Mass.

[73] Assignee: Deltalab Research, Inc., Chelmsford, Mass.

[21] Appl. No.: 339,185

[22] Filed: Jan. 13, 1982

[51] Int. Cl.³ ............................................. H04B 12/04
[52] U.S. Cl. ..................................... 375/30; 332/11 D
[58] Field of Search ............... 332/9 R, 11 D; 375/30, 375/31, 32; 340/347 AD, 347 M, 347 DD, 347 CC

[56] References Cited

U.S. PATENT DOCUMENTS

| | | | |
|---|---|---|---|
| 3,568,062 | 3/1971 | Brolin | 375/30 |
| 3,621,396 | 11/1971 | Daugherty | 375/32 |
| 3,735,264 | 5/1973 | Mauduech | 375/30 |
| 3,746,990 | 7/1973 | Le Diberder et al. | 375/30 |
| 3,757,252 | 9/1973 | Deschenes et al. | 375/32 |
| 3,979,676 | 9/1976 | Poma | 375/32 |
| 4,190,801 | 2/1980 | De Freitas | 375/30 |
| 4,254,502 | 3/1981 | De Freitas | 375/30 |
| 4,352,191 | 9/1982 | Un | 375/30 |

Primary Examiner—Benedict V. Safourek

[57] ABSTRACT

In an electrical system of the type in which a digitally-encoded signal is determined at least in part by the difference between a present value of an analog input signal and a reconstructed signal representative of a past value of the input signal and including signal generating means for generating said reconstructed signal, which means is responsive to a reference signal, improved circuitry for generating the reference signal. The improved circuitry comprises a ladder network which increases the magnitude of the reference signal as a function of the length of time the digitally-encoded signal continuously remains in either digital state without a change to the other digital state.

15 Claims, 2 Drawing Figures

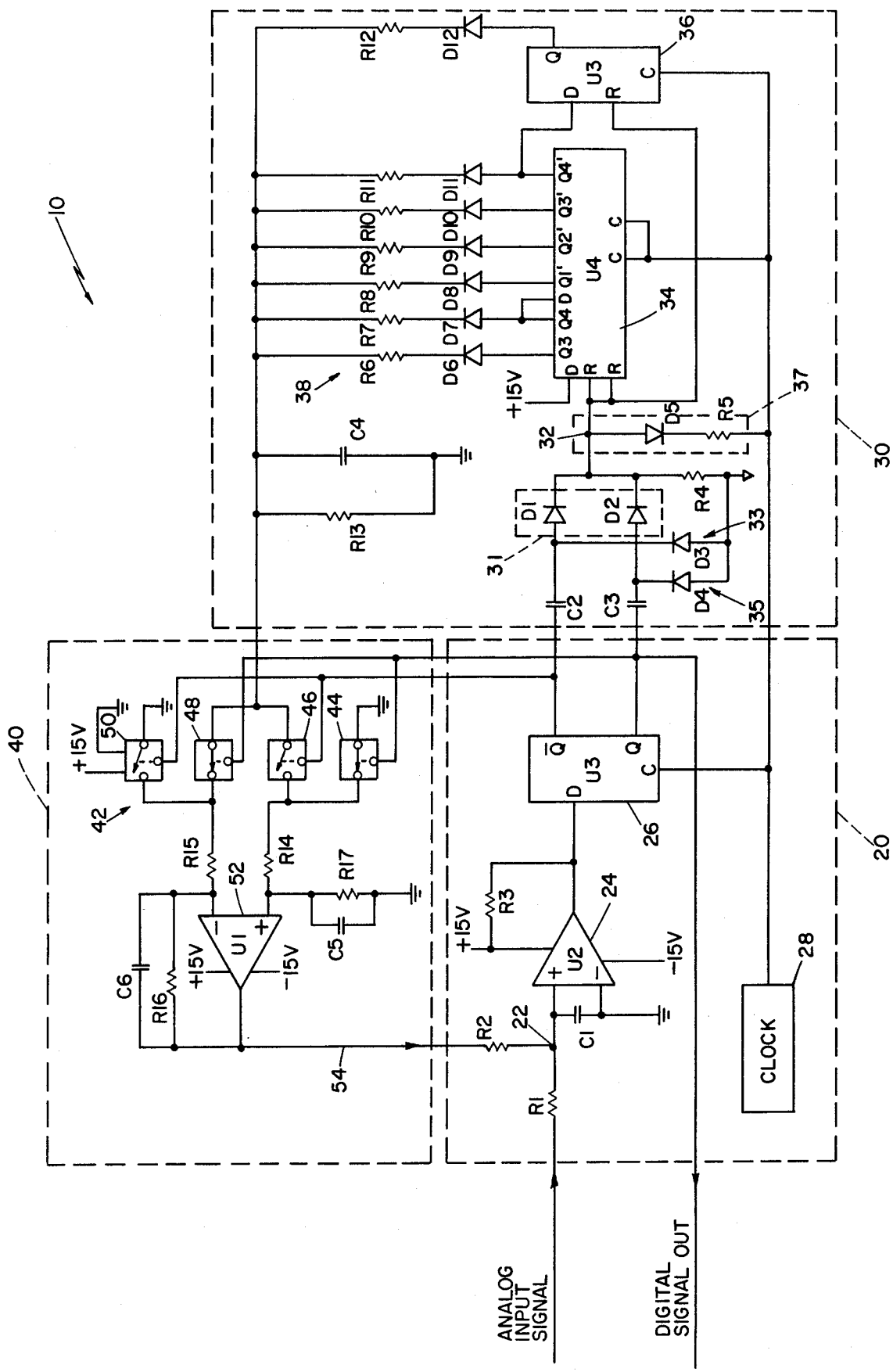

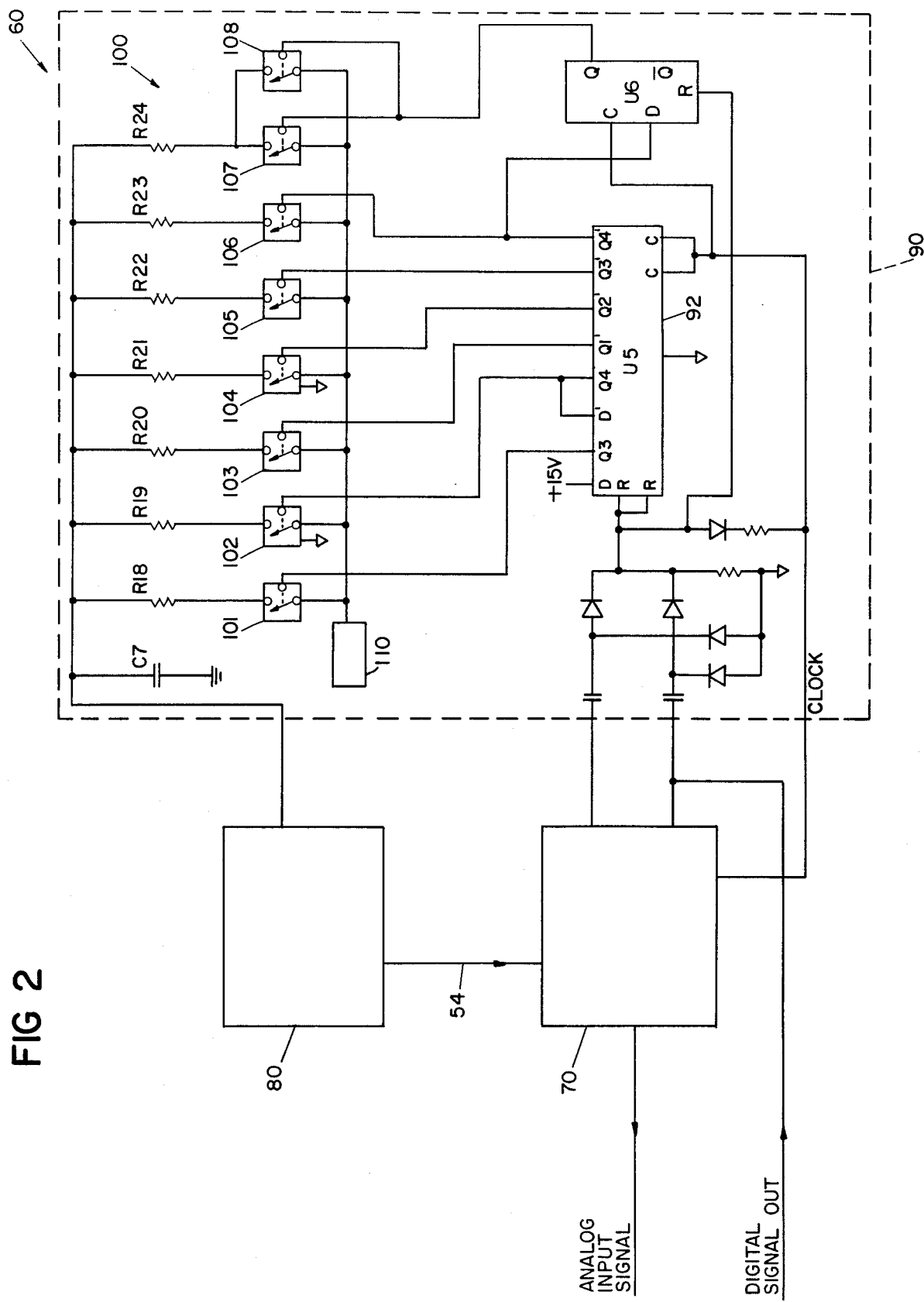

DIGITAL ENCODING CIRCUITRY

BACKGROUND OF THE INVENTION

This invention relates to digitally encoding and decoding electrical signals, the background for which is fully set forth in DeFreitas U.S. Pat. No. 4,190,801 and DeFreitas et al. U.S. Pat. No. 4,254,502, both incorporated herein by reference.

In DeFreitas U.S. Pat. No. 4,190,801, an analog input signal is digitally encoded based upon the difference between that input signal and a reconstructed signal. The reconstructed signal is an analog representation of the digitally-encoded signal, and thus the reconstructed signal closely approximates the analog input signal at a slightly earlier time. Therefore, as a result of this difference comparison, changes in the analog input signal are accurately reflected in the encoded digital one.

In DeFreitas et al. U.S. Pat. No. 4,254,502, in order to enable the reconstructed signal to more accurately track a rapidly increasing or decreasing analog input signal, the reconstructed signal is generated by using a reference signal from a peak detector and an audio filter, the input to which combination is weighted by several parallel resistors. If the digital state of the encoded signal remains constant, indicating that the analog input signal is consistently either above or below the reconstructed one as it might be with a rapidly falling or rising analog input signal, more current is supplied to the audio filter through successive resistors. This increases the magnitude of the reference signal thereby increasing the absolute value magnitude of the reconstructed signal so that it closely approximates that of the actual analog signal.

SUMMARY OF THE INVENTION

This invention features in a digitally-encoding and decoding circuit a reference signal generating circuit comprising a simple and inexpensive ladder network, which provides a weighting function so that the longer the digitally-encoded signal remains in one digital state, the larger the reference signal generated.

In a preferred embodiment, the ladder network comprises a number of series-connected resistors and diodes, all of which are arranged in parallel and connected between a shift register and a common input of the reconstructed signal generator circuit. With a continuous steady-state digitally-encoded signal, the shift register sequentially sends current through successive resistor-diode branches thereby increasing the magnitude of the reference signal to the reconstructed signal generator circuit.

In another embodiment, the ladder network comprises a number of switches with series-connected resistors, all generally arranged in the same manner as the resistor-diode combinations of the previous embodiment, except that each switch is tied to a variable voltage source, and current from the voltage source is applied to the reconstructed signal generator circuit through each switch-resistor branch, as it is activated.

DESCRIPTION OF THE PREFERRED EMBODIMENTS

We now turn to a description of the preferred embodiments, after first briefly describing the drawings.

FIG. 1 is a schematic circuit diagram of an encoder of the preferred embodiment of the invention; and FIG. 2 is a schematic circuit diagram of an encoder of another preferred embodiment.

CIRCUITRY

Referring to FIG. 1, an encoder circuit is shown at 10. Encoder circuit 10 generally comprises a convertor circuit 20, a reference signal generator circuit 30 and a reconstructed signal generator circuit 40.

The convertor circuit 20 is similar to that of DeFreitas et al. U.S. Pat. No. 4,254,502. A summing junction 22 receives the analog input signal and a reconstructed signal 54 from the circuit 40. As these signals have opposite polarity, the difference between them appears at the positive input of comparator 24. The comparator output is the data input for flip-flop 26, which receives a clock pulse from clock 28. The clock pulses have a frequency selected between 250 Khz and 1 MHz. The Q output of flip-flop 26 is the digitally-encoded output for the encoder circuit 10.

The complimentary Q and Q bar outputs of flip-flop 26 are received by respective inputs for an OR gate 31 of circuit 30. The OR gate is made up of diodes D1 and D2, the anodes of which are connected to Q and Q bar respectively, and the cathodes of which are connected together. A pair of pulse generating circuits, designated generally at 33, 35, the operation of which will be explained hereinafter, are connected to each of the inputs to the OR gate 31. Pulse generating circuit 33 comprises a capacitor C2 and diode D3. Capacitor C2 is connected in series with OR gate diode D1, and diode D3 is connected between the anode of diode D1 and ground. The anode of diode D3 is also connected to the output of the OR gate 31 through resistor R4. The other pulse generating circuits 35 is identical, comprising capacitor C3 and diode D4 connected to the other OR gate diode D2.

The output of OR gate 31 is one input to an AND gate 37 formed by junction 32 and diode D5 in series with resistor R5. The other AND gate input is the clock signal through the diode D5 and resistor R5, and the clock signal is gated through the AND gate 37 to a reset of shift register 34 only when the output of OR gate 31 is high.

Shift register 34 is a dual, four-bit shift register with its stages connected in series to form an 8-bit register. The outputs of each stage are sequentially Q1 to Q4 and Q1' to Q4'. Only the last six stages of the series-connected registers, however, are used in the preferred. The output Q4' of the last stage is also connected to the data input for a flip-flop 36, the Q output of which provides an additional, ninth, shift register output. It will be appreciated, however, that flip-flop 36 is unnecessary, if shift register 34 has the desired number of stages.

Each of the seven shift register outputs used (Q3, Q4, Q1', Q2', Q3', Q4' from shift register 34 and Q from flip-flop 36) are connected to a resistor-diode ladder network 38. As shown in the component table below, the resistors R6–12 of the network 38 have decreasing values, with resistor R6 having the highest value attached to the lowest shift register output Q3. Diodes D6–12 are identical. The resistors R6–12 are all tied to the input of reconstructed signal-generating circuit 40. A capacitor C4 and resistor R13 are also connected to the common input line to circuit 40.

Circuit 40 comprises a switching circuit 42 having four switches 44, 46, 48, 50. The switches 44–50 are controlled by the state of Q and Q bar of flip-flop 26, and the combined input from the ladder network 38 is fed to an integrator 52 through either switch 46 or switch 48, depending upon the state of Q and Q bar. Switches 44, 50 ground whichever integrator input is not carrying the current from the ladder network 38. The integrator 52 functions as the one in DeFreitas et al. U.S. Pat. No. 4,254,502 to produce the reconstructed signal 54 fed back to the summing junction 22.

A decoder embodying the invention has identical circuitry as this encoder, except that the comparator 24 and summing junction 22 are omitted. The reconstructed signal would be the audio output, and the digital signal to be decoded would feed the data input of what would correspond to flip-flop 26.

The circuit components used are given in the following table:

| Component Table | | |
|---|---|---|
| R1 | 24.9K | 1% |
| R2 | 20K | 1% |
| R3 | 1K | 5% |
| R4 | 30K | 5% |
| R5 | 1K | 5% |
| R6 | 310K | 1% |
| R7 | 140K | 1% |
| R8 | 44.2K | 1% |
| R9 | 14.0K | 1% |
| R10 | 4.42K | 1% |
| R11 | 1.40K | 1% |
| R12 | 442 | 1% |
| R13 | 6.81K | 1% |
| R14, 15 | 20.0K | 1% |
| R16, 17 | 3M | 5% |
| C1 | 68pF | |
| C2, 3 | 150pF | |
| C4 | 1µF | |
| C5, 6 | 1000pF | |
| All diodes | IN4148 | |
| U1 | TL 082 op. amp. | |
| U2 | LM311 comparator | |
| U3 | 4013 flip-flop | |
| U4 | 4015 (CMOS dual 4-bit shift register) | |

OPERATION

The overall operation is similar to that DeFreitas et al. U.S. Pat. No. 4,254,502. An analog input signal is received and compared with the reconstructed signal from circuit 40. The polarity of the difference determines the state of the Q output of flip-flop 26, and the Q output is the digitally-encoded output signal for the system. Both the Q and complimentary Q bar outputs of flip-flop 26 are fed to the OR gate 31 of the circuit 30. Normally, the output of the OR gate would be high when either of its inputs is high, which if attached to complimentary outputs Q and Q bar would be all the time, as either one or the other would always be high. The pulse generator circuits 33, 35, however, change that somewhat. When Q and Q bar change states, the output of the OR gate remains high only momentarily, because the pulse generator circuit immediately drains away the output level voltage. Therefore, the OR gate, with the pulse generators 33, 35 is similar to a one-shot multivibrator, and it produces a short duration, positive pulse when its inputs, Q and Q bar, change. Therefore, if the analog input signal is consistently above or below the reconstructed signal from the integrator 52, the output from comparator 24 will remain unchanged, and Q and Q bar will remain unchanged. The OR gate produces no output pulse during this period, and the shift register 34 does not reset. The data input of the shift register 34 is tied high to 15 volts, and the clock pulses are continually received at the clock inputs for the register. Therefore, as long as this steady state condition exists, the register counts by sequentially having the outputs Q1-Q4' of its stages go high for each clock pulse received. Thus, a steady-state condition for five successive clock pulses would turn on the Q1 to Q4 outputs of shift register 34. Only the Q3 and Q4 outputs are actually used, and current would be supplied to circuit 40 through the resistor-diode branches R6-D6 and R7-D7 of the ladder network 38, which are connected to the Q3 and Q4 register outputs. If the steady-state condition continued, more current would be supplied to circuit 40 through successive resistor-diode branches as more of the shift register stages produced an output. It should be noted, however, that although the voltage supplied by each stage of the shift register is the same, the decreasing value of the resistors in the successive branches of the ladder network means that, for each additional branch activated, considerably more current is added to the total. As the current to the integrator 52 increases, it produces a larger reconstructed signal, which closely duplicates the actual analog input signal.

When the magnitude of the analog input signal, as opposed to the reconstructed signal changes, e.g., if the absolute value of reconstructed signal which was previously smaller than the analog signal now becomes larger than the analog signal, the output of the comparator 24 changes to its opposite state, which will change the states of Q and Q bar. A brief output pulse will be produced at the OR gate output, as previously described, and the shift register outputs will all go to zero. as the OR gate pulse will have sent a reset signal to the register 34. If this new Q and Q bar condition remains unchanged, the register counts up again until reset.

OTHER EMBODIMENTS

Another embodiment of the invention is shown by an encoder circuit 60 of FIG. 2. Circuit 60 is identical to that of FIG. 1 for the converter circuit 70 and the reconstructed signal-generating circuit 80, and they are only shown as block diagrams here.

The reference signal generator circuit 90 of this embodiment is also the same as in the previous embodiment, except for the ladder network 100. Each Q output which is used from shift register 92 and Q from flip-flop 96 are connected to activate one of a series of switches 101-108. Each switch is connected between a variable voltage source 110, having a voltage between 0 and 15 volts, and a resistor, R18-24. The resistors are connected to the input for circuit 80.

The circuit works in the same manner as in the previous embodiment. As the shift register counts, successively more of the switches 101-108 close, and more current flows to the circuit 80. However, because the voltage applied to the switches is variable, it is possible to preselect the voltage so that more or less current will be supplied the integrator as each branch of the ladder network 100 is turned on.

All resistors and diodes have the same values as the corresponding ones in FIG. 1. The shift register 92 and flip-flop 96 are also the same as those in FIG. 1. The switches are from a 4016B, and filter capacitor C7 is 3.3 µF.

Other embodiments are within the scope of the following claims.

What is claimed is:

1. An electrical system of the type in which a digitally-encoded signal with high and low states is determined at least in part by the difference between a present value of an input signal and a reconstructed signal representative of a past value of said input signal, and in which the occurrence of a high or a low state in said digitally-encoded signal corresponds to an incremental change in said input signal of an amount dependent upon a reference signal determined from said digitally-encoded signal, said reconstructed signal being generated by a reconstructed signal generating means, said electrical system being characterized by a reference signal generating circuit comprising > ladder network means having a plurality of branches, each of which when activated increase the magnitude of said reference signal and thereby the magnitude of said incremental change in said input signal, and each of which when deactivated decrease the magnitude of said reference signal and thereby the magnitude of said incremental change, said ladder network means comprising
>> unidirectional-current-flow means for permitting current flow in only one direction through said branches, and
>> charge-discharge means connected to the output of said branches for responding to activations and deactivations thereof by respectively increasing and decreasing said reference signal and for making the rate of increase of said reference signal greater than the rate of decrease,
>
> means for activating a greater number of said branches in response to an increase in the number of repetitions of one state in said digitally-encoded signal, said means for activating including means for applying a voltage of a polarity to cause current flow through said unidirectional-current-flow means, and
> means for deactivating some or all of said branches in response to an end of said repetitions, said means for deactivating including means for removing said voltage from some or all of said branches.

2. The electrical system of claim 1 wherein said means for permitting current flow in only one direction comprises a diode.

3. The electrical system of claim 1 wherein said means for permitting current flow in only one direction comprises a switch.

4. The electrical system of claim 3 wherein said switch is normally opened and connected to a voltage source, and activating a said branch comprises closing said switch so that current from said source flows so as to increase the magnitude of said reference signal.

5. The electrical system of claim 4 wherein said voltage source is a variable voltage source.

6. The electrical system of claim 1 wherein said reference signal generating circuit includes means to sequentially activate successive branches of said ladder network for each repetition of the same digital state in said digitally-encoded signal.

7. The electrical system of claim 6 wherein said reference signal generating circuit includes a reset means for deactivating all of said branches of said ladder network upon a change of the digital state of said encoded signal.

8. The electrical system of claim 1 wherein said reconstructed signal generating means includes means for receiving said reference signal and for using said reference signal to change the amount by which said reconstructed signal is incremented in response to a high or a low state in said digital signal.

9. The electrical system of claim 1 wherein said electrical system includes an amplifier means for amplifying or attenuating said input signal, said amplifier means including means for receiving said reference signal and for using said reference signal to change the amount by which said input signal is amplified or attenuated.

10. The electrical system of claim 1 wherein there are five or more branches in said ladder network.

11. The electrical system of claim 10 wherein there are six or more branches.

12. The electrical system of claim 11 wherein there are seven branches.

13. The electrical system of claim 1 wherein said reference signal changes in magnitude upon an additional branch being activated by a factor of about 3.

14. The electrical system of claim 8 wherein said signal generating means comprises an integrator circuit.

15. The electrical system of claim 1, 2, or 3 wherein each branch further comprises a resistor in series with the means for permitting current flow in only one direction.

* * * * *